(12) United States Patent
Karabatsos

(10) Patent No.: US 6,266,252 B1
(45) Date of Patent: Jul. 24, 2001

(54) APPARATUS AND METHOD FOR TERMINATING A COMPUTER MEMORY BUS

(76) Inventor: Chris Karabatsos, 42 Jumping Brook La., Kingston, NY (US) 12401

( * ) Notice: Subject to any disclaimer, the term of this patent is extended or adjusted under 35 U.S.C. 154(b) by 0 days.

(21) Appl. No.: 09/394,975

(22) Filed: Sep. 13, 1999

Related U.S. Application Data

(63) Continuation-in-part of application No. 09/105,892, filed on Jun. 26, 1998, now Pat. No. 5,953,215
(60) Provisional application No. 60/145,202, filed on Jul. 23, 1999, and provisional application No. 60/067,210, filed on Dec. 1, 1997.
(51) Int. Cl.[7] ................................................... H01R 9/09
(52) U.S. Cl. .................... 361/788; 710/101; 710/102; 710/107; 710/131; 395/834
(58) Field of Search .................... 361/788, 736, 361/781, 832, 828; 365/230.03, 233, 51–52; 257/295; 395/425, 834; 710/131, 101–102, 107

(56) References Cited

U.S. PATENT DOCUMENTS

| | | | | |
|---|---|---|---|---|
| 5,530,623 | * | 6/1996 | Sanwo et al. | 361/788 |
| 6,070,217 | * | 5/2000 | Connolly et al. | 710/131 |

* cited by examiner

*Primary Examiner*—Jeffrey Guffin
*Assistant Examiner*—Thanh Y. Tran
(74) *Attorney, Agent, or Firm*—Mark P. White

(57) ABSTRACT

A method and apparatus for enhancing memory speed and capacity utilizes a set of electronic switches to select a proper termination chip for the computer system bus. The apparatus includes one or more multi-sided termination boards with etched leads, lands and feed-throughs. The termination chips may be mounted on either one side, or both sides of each board. Connection between the termination boards and the mother board are made by means of a comb of contact fingers or edge-connector which mates with a connector on the mother board. The data lines and address lines of the computer bus are distinct from each other, and routed to the termination board via the edge connector. A set of CMOS TTL or FET switches are located adjacent to the comb, and are switched on and off by a decoded combination of address, control, or data lines or by a distinct enable line provided by the CPU, controller or other decoding means located on the motherboard. The termination board is used in a system in which system memory is implemented by a number of switchable DIMMs in which only one at a time is selected. The termination board contains a number of different termination chips, with the proper termination chip selected by electronic switches. The selection of the proper termination chip is electronically coordinated with the selection of the proper DIMM.

5 Claims, 4 Drawing Sheets

APPARATUS AND METHOD FOR TERMINATING A COMPUTER MEMORY BUS

This application is a continuation-in-part of application Ser. No. 09/105,892, now U.S. Pat. No. 5,953,215 Sep. 14, 1999 which claims priority based on provisional application Ser. Nos. 60/067,210, filed on Dec. 1, 1997, and 60/145,202, filed on Jul. 23, 1999.

FIELD OF THE INVENTION

The present invention relates to computer systems with enhanced memory access performance, and more specifically, to systems which so provide by electronically terminating the memory bus in its characteristic impedance.

DESCRIPTION RELATIVE TO THE PRIOR ART

Increasing computer performance and capacity has resulted in a constant demand for larger amounts of RAM (random-access memory), and faster RAM memory.

Factors which limit the amount and speed of RAM include the configuration of the memory chips which contain the RAM, and the interconnections on the printed circuit boards which carry the chips.

As it pertains to the memory packaging used today in the industry to assemble memory, and in order to meet a desired DATA BUS width which is standard in the industry, a cluster of memory chips are assembled together on a printed circuit board. These boards are of several types, known as SIMMs, DIMMs, SODIMMs, RIMMS, etc. However, for the sake of brevity, the term DIMM will be used hereinafter to refer to any or all of these different types.

The DIMMs have conductive pads at the edge of the boards, called edge connectors, which make the electronic connection required when inserting into connectors, which also act to support the DIMMs and the memory chips which are assembled on DIMM boards.

The connectors are generally soldered onto a motherboard to facilitate channeling the conductive lines from the computer processor (CPU), or from the controller chip to the DIMM memory chips, or DRAMs (or other type of memory chip as previously described). There are DATA LINES, ADDRESS LINES, AND CONTROL LINES, which together form the computer BUS SYSTEM.

The DATA LINES are bi-directional. They connect bi-directional points of the CPU or controller with the bi-directional points of the DRAM chips that are on the DIMMs. Any physical printed wire length between two points will be driven by an electronic component, the driver (D), and be received by another electronic component, the receiver (R). The speed by which the physical printed wire is charged up depends on several factors one of which is the ability of the electronic component that drives or activates this line to provide such required charge, and the other is the total capacitance of the line been charged and other parameters. The amount of charge accumulated on the line is determined by the Capacitance of the line. By the laws of physics, each printed wire forms a capacitor whose capacitance is the capacitance of the printed wire line length and the capacitance of all the electronic component pins and circuits connected to the line.

When connectors for D are clustered on the BUS to make up the desired memory density for the specified system, the cumulative capacitance on each DATA LINE is increased. In order to attain desired speed performance, it is specified for the system to have a limited number of DIMMs attached to the BUS before the DATA LINES are required to be re-powered, or redriven.

The present construction of the DIMMs is such that a number of DRAMS are connected together in order to increase the memory density. Each DRAM chip pin presents a specified capacitive load. The printed wire line that is used to connect all the DRAM chips together adds to the capacitive load. The total allowable capacitive load that is measured at the entry TAB of the DATA LINE at the DIMM is specified by the system board designer and becomes the limiting factor of how many DIMMs can be used on the BUS to make up the desired density.

During operation, only one DIMM is selected at a time. However the selected DIMM data lines see the entire capacitive load that is present on the entire bus by all other DIMMs, the connectors, and the motherboard printed wire length, plus all other factors.

The individual leads are not perfect conductors, however, especially at the high speeds at which modem computers run. The memory access speeds are today measured in nanoseconds ($10^{-9}$ seconds), with picosecond ($10^{-12}$ seconds) speeds on the horizon for personal computers.

At such speeds, resistance of the leads, and the capacitance between leads forms a resistance-capacitance circuit which causes the pulses traveling between the connectors and the memory chips to become degraded, sometimes to the point of becoming unreliable.

It is well known that a resistance in series with a capacitance will effect a time delay which is described by $$\Delta t = 1/(RC)$$

where $\Delta t$=the time delay caused by the RC circuit

R=the resistance

C=the capacitance

The result of such an RC delay is to cause a series of sharply defined pulses to become undetectable at some point. Consider, as an example, the idealized pulses shown in FIG. 2a. These have perfectly sharp comers 52, 54, and are easy to detect, but such a waveform is rarely seen at high speeds. Rather, the capacitance which is always present may cause each pulse to exhibit a rise time 56, and a fall time 58. As seen in FIG. 2c, when the rise time 60, and fall time 62, become excessive compared to the pulse width 64, the pulses become highly distorted, and difficult to detect, resulting in detection errors which may become unacceptable.

Thus, the speed at which the memory can be accessed is a direct function of the capacitance an resistance of the leads, as well as other factors. The capacitance is especially troubling, because the capacitance of each line adds to the capacitance of the others. This addition of the capacitances also limits the number of memory chips which can be used to populate a memory board, since the more memory chips, the more leads, and the more leads, the more capacitance is introduced.

To date, no provisions have been made by the industry to use any means to isolate a selected memory module from non-selected memory modules in order to reduce capacitive load and increase speed. No prior art has been found which has utilized FET switching to accomplish such isolation.

The current invention solves this problem by isolating the data leads from the edge connector by means of high-speed FET switches, located close to the connector, which effectively negates the additive effect of line capacitances, as will be described infra.

As used in many personal computer systems, the system is provided with less than the maximum number of memory cards possible, leaving connectors available for later memory expansion. In high speed systems the bus connecting the DIMMs is, in effect, a transmission line, with the attending, well-known problems of standing waves, reflections at the terminations, etc. A standard technique for reducing or eliminating reflections and similar transmission line problems is to terminate the line in its characteristic impedance. However, in a system in which only one of several DIMMS are selected in any given memory access, the characteristic impedance will change according to which DIMM is selected. As a result, reflections on the bus, resulting in standing waves, may degrade signal performance to the point where the signal is unreliable.

The current invention solves this problem by means of a high-speed FET switch, located close to the connector on the DIMM termination board, which selects one of several different terminations, as will be described infra.

SUMMARY OF THE INVENTION

It is the general object of this invention to provide an high-speed RAM memory for use in computer systems without sacrificing capacity, or alternatively, to provide a high-capacity memory without sacrificing speed. It is a specific object of this invention to provide such high speed, or high capacity memory by terminating the memory bus with a termination card containing an electronically switchable termination circuit.

According to one aspect of the invention, a method for enhancing the performance of an electronic system which comprises a multiplicity of printed circuit boards, a motherboard containing a bus, having a characteristic impedance, includes a number of elements. These include terminating the bus with a termination card, mounting onto said termination card one or more switches, each having an on state and an off state, and each having an input and output, in which the input is connected to the output via a low resistance in the on state and a high resistance in the off state, and mounted to the board in proximity to the comb, and mounting onto said termination card one or more termination chips. Each of these chips is electrically connected to the output of a corresponding switch by a plurality of leads, and each of these chips presents an impedance to the output of the corresponding FET switch. In addition, the method further includes conductively connecting a plurality of leads between the comb and the switches, providing selection means to turn the switches for each board on or off, and switching on one of the termination chips. The termination chip thus selected is connected to the bus, and , the impedance presented by the selected termination chip being thus matched to the characteristic impedance of the bus.

According to another aspect of the invention, the switch is selected from the group which consists of field-effect transistor switches, complementary metal oxide semiconductor switches, and transistor-transistor logic switches. According to yet another aspect of the invention, an electronic device includes a multiplicity of printed circuit boards, each board further comprising a multiplicity of electronic components having a capacitance, and a comb of connecting terminals. It also includes a motherboard, a bus, having a characteristic impedance, contained on the motherboard, a multiplicity of connectors electrically connected to the bus, into each of which except one the comb of a corresponding board is matingly inserted and electrically connected. The terminals present a capacitance to the bus including the capacitance of the components. The invention also includes a switch mounted onto each such board in proximity to the comb, having an on state and an off state, and having an input and output, in which the input is connected to the output via a low resistance in the on state and a high resistance in the off state. It further includes a plurality of leads conductively connecting the combs and the input of the switch for each such board, a plurality of leads conductively connecting the output of the switch and the electronic components, and selection means to simultaneously turn the switch of a single selected board on, while maintaining the non-selected boards off. It finally includes a terminator board, which further includes a comb of connecting terminals one or more switches, each having an on state and an off state, and each having an input and output, in which the input is connected to the output via a low resistance in the on state and a high resistance in the off state, and mounted to the board in proximity to the comb, one or more termination chips, each of which is electrically connected to the output of a corresponding switch by a plurality of leads, and each of which presents an impedance to the output of the corresponding FET switch. A plurality of leads conductively connect the comb and the switches, and selection means turn the switches for terminator board on or off. In operation, only a single board is connected to the bus at any time, and the terminator board presents the characteristic impedance of the bus.

According to still one more aspect of the invention, an electronic apparatus includes one or more printed circuit boards. a multiplicity of electronic components mounted on each board, each electronic component having a capacitance, a bus, having a characteristic impedance, and a switch located on each board, the switch having an on state and an off state, each switch having a low resistance in the on state and a high resistance in the off state. The apparatus further includes a plurality of leads conductively connected to between the bus and the switches, a plurality of leads conductively connected between the switches and the electronic components; selection means to simultaneously turn the switch of a single selected board on, while maintaining the non-selected boards off, and a terminator board. The terminator board, in turn, further includes a comb of connecting terminals, one or more switches, each having an on state and an off state, and each having an input and output, in which the input is connected to the output via a low resistance in the on state and a high resistance in the off state, and mounted to the board in proximity to the comb. The terminator board further includes one or more termination chips, each of which is electrically connected to the output of a corresponding switch by a plurality of leads, and each of which presents an impedance to the output of the corresponding FET switch, a plurality of leads conductively connecting the comb and the switches, and selection means to turn the switches for terminator board on or off.

As a result, only a single board is connected to the bus at any time, and the terminator board presents the characteristic impedance of the bus.

According to a final aspect of the invention, an electronic apparatus includes a motherboard of insulating substrate having a network of conductive leads applied, pads located on the motherboard for attaching memory elements, a multiplicity of memory elements mounted on the motherboard via the pads, a bus, having a characteristic impedance, conducting data and address leads to the memory elements, a plurality of switching devices having an on state and an off state, each switching device having a low resistance in the on state and a high resistance in the off state, a plurality of leads conductively connected to between the bus and the switching devices, and a plurality of leads conductively connected between the switching devices and the memory element. The apparatus further includes means to turn selected switches on and off and a terminator board. The terminator board further includes a comb of connecting terminals, one or more switches, each having an on state and an off state, and each having an input and output, in which the input is connected to the output via a low resistance in the on state and a high resistance in the off state, and mounted to the board in proximity to the comb. In addition, the terminator board includes one or more termination chips, each of which is electrically connected to the output of a corresponding switch by a plurality of leads, and each of which presents an impedance to the output of the corresponding FET switch, a plurality of leads conductively connecting the comb and the switches, and selection means to turn the switches for terminator board on or off.

Connections to the bus are made to selected memory elements only, the nonselected memory elements being isolated from the bus, and the terminator board presents the characteristic impedance of the bus.

BRIEF DESCRIPTION OF THE DRAWINGS

These, and further features of the invention, may be better understood with reference to the accompanying specification and drawings depicting the preferred embodiment, in which.

DETAILED DESCRIPTION OF THE PREFERRED EMBODIMENTS

Figure 1:
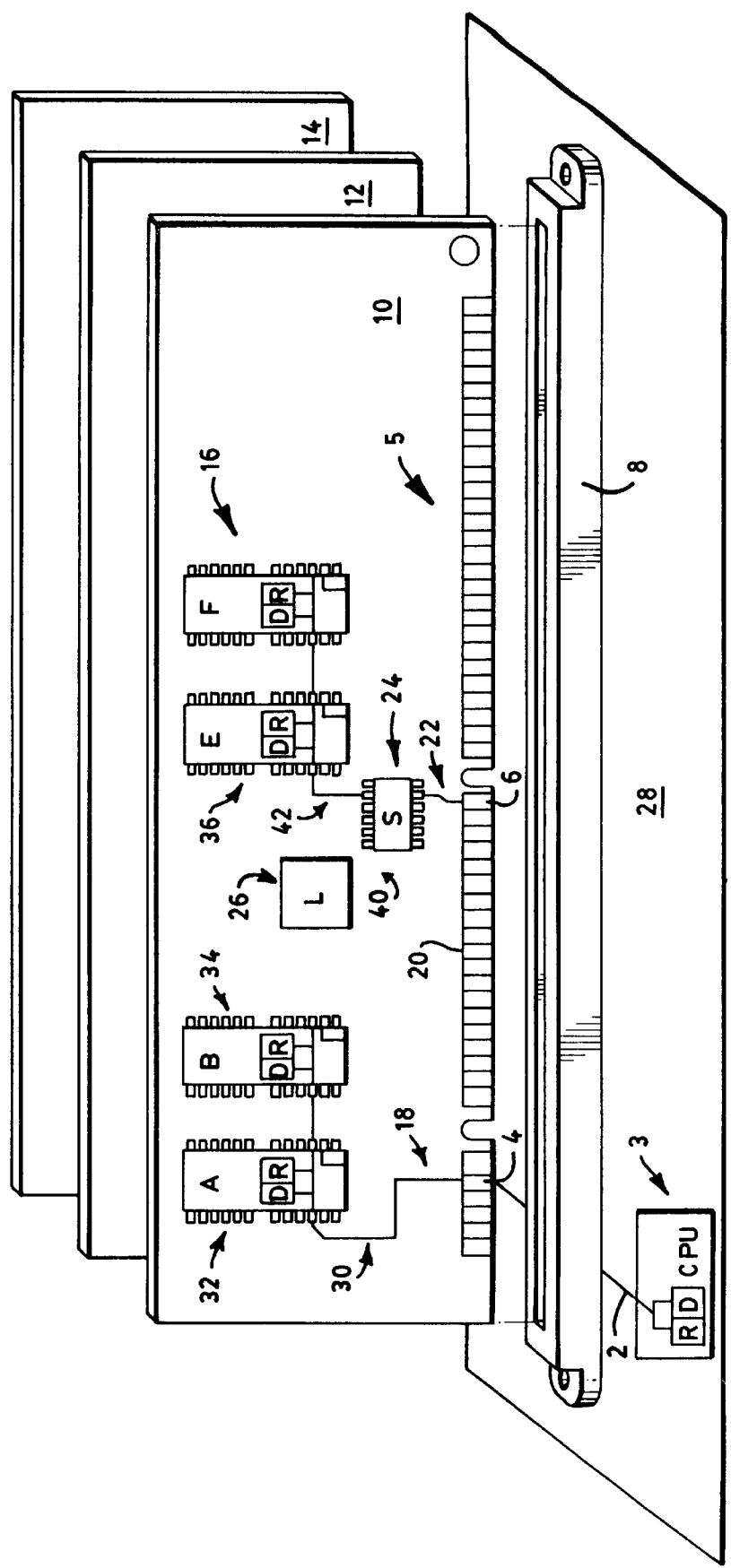
FIG. 1 depicts a perspective view of the invention, showing the electronic components on a multi-board memory configuration.
Figure 2A:
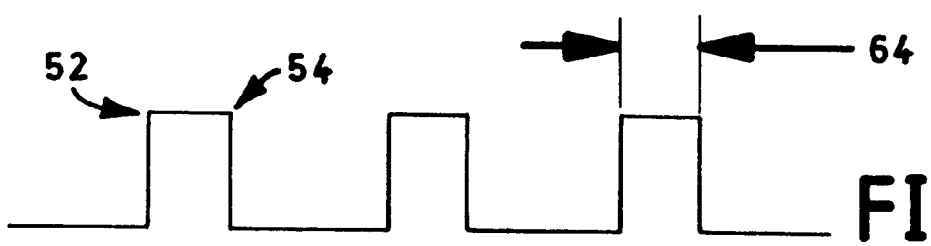
FIG. 2a depicts a memory-timing diagram with no delay.
Figure 2B:
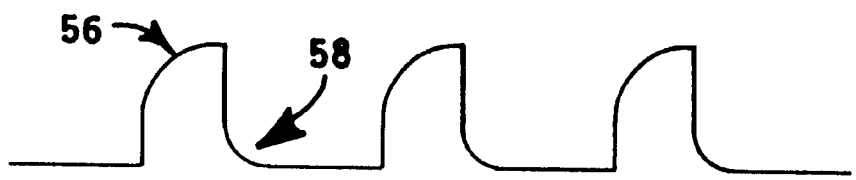
FIG. 2b depicts a memory-timing diagram with a slight delay.
Figure 2C:
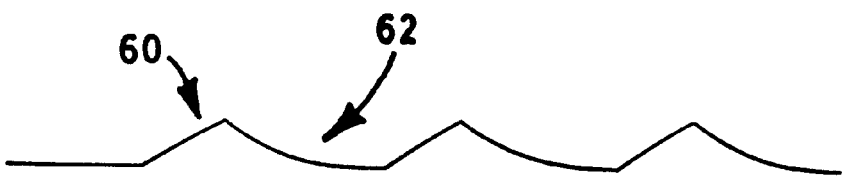
FIG. 2c depicts a memory-timing diagram with a large delay.

Referring now to FIG. 1, the memory assembly consists of three boards, or substrates 10, 12, 14. Substrate 10 contains an edge connector 5 which, in turn, contains a number of fingers which mate with connector 12, which is, in turn, mounted on motherboard 28. The boards are substantially quadrangular, in accordance with current standards for such boards. It will be seen that the edge connector is a comb-like array of individual conducting fingers. It should be noted that although three boards are included in this embodiment, there is no inherent limitation to the number of boards which may be included in the current invention.

The boards shown may be multi-layer boards, which are, in effect, a number of connection layers bonded together. Interconnection between the different layers, and between the three substrates shown is by means of feed-throughs, plated-through holes which extend the width of each substrate, and which may connect with conductive material on each layer. The chips shown mounted on the substrates are electrically connected through conductive mounting pads, which provide an extended conductive area to allow good contact between the pins of the computer chips and the leads on the substrates.

Although not shown in FIG. 1, it is often desirable, in order to present the greatest density of computer chips possible, to mount these chips on both mounting surfaces of each substrate. It is clear that, regardless of how many layers of conductive material are used in each substrate, only two mounting surfaces are available.

Shown mounted on the motherboard 28 is a CPU 3, which is not part of this invention. The signals conveyed to the memory board might be generated by a controller chip rather than the CPU. In either case, the signals are connected to the memory board by means of a bus. At present, the computer bus consists of a multiplicity of data lines, a multiplicity of separate address lines, and a multiplicity of control lines. When these lines are etched onto a printed circuit board, such as the motherboard or the memory board, they are called leads. In FIG. 1, a single lead only 2 is shown running from the CPU to the connector 5 via finger 4. The single lead is shown for the sake of clarity, although in reality there are a multiplicity of such leads. When the edge connector 5 is inserted into the connector 8, there will be electrical conductivity from finger 4 onto the memory board 10 via lead 30.

Still referring to FIG. 1, a FET ( field-effect transistor) switch 24 is mounted on the memory board 10 and inserted in series with each DATA LINE. It should be noted that other types of switches are applicable to this application, including, inter alia, CMOS (Complementary Metal Oxide Semiconductor), and TTL (Transistor-Transistor Logic) switches. Whatever technology is used, the switch should have a high impedance in the OFF, or disabled state, a low impedance and negligible propagation delay in the ON, or enabled state, and low capacitance in both states. The switch must be bi-directional in the ON state with negligible propagation delay in both directions, and negligible transmission of the input signal in the OFF state.

A single data lead 22 is shown for the sake of clarity, although in reality there are a multiplicity of such leads. The switch is placed as close to the edge connector 5 as possible in order to minimize the distance of the lead 22 from the finger 6 to the pin of the FET switch 24.

Also shown in FIG. 1 are a number of DRAM chips A, B, E, and F. The other corresponding pin of the switch is wired to the DRAM pins corresponding to the DATA LINE associated with DRAM chips E and F by means of lead 42, which is electrically connected with lead 22 when the switch is closed, or in it ON state. The state of the switch is controlled by the logic decoder 26, which enables switch 24 via line 40. Again, there are a multiplicity of switches, driving the data leads of the memory chips via a multiplicity of leads; a unique enable line to the switch could be provided from the CPU or controller—however, a single lead 42 is shown for the sake of clarity.

When the switch is open, or in the OFF state, there will be a very high-impedance connection between the finger 6 and the lead 42. In effect, finger 6 appears to be the equivalent of an open circuit. The amount of capacitive load presented to the DATA LINE of the BUS by the switch is less than 10 pF (picofarads). The capacitive load presented by the DRAM chips and wires on the side of the FET switch facing the DRAMs is totally isolated from the data bus lines.

When the switch is enabled, on the other hand, the DATA LINE sees the additional capacitive load from the internal connection of the switch 24 to the lead 42, and its connections to the chips 36 and 16. If this internal load is 25 pF, then the total load on the DATA LINE contributed by the selected memory chip is 30 pF, which includes an additional 5 pF of stray capacitance.

Consider now, as an example, a typical memory system, containing 16 DIMMs, which has been tested using the current invention. If no DIMM is selected, the total capacitance seen by each data line is 10 pF per DIMM, or a total of 160 pF.

Assume next that a particular memory access selects only a single one of these 16 DIMMS. Then the capacitive load presented by the 15 DIMMs not selected will be 10 pF per DIMM, or 150 pF. In addition, the single selected DIMM will contribute 30 pF. Thus, the total capacitance presented to the bus will be 150 pF plus 30 pF, or 180 pF.

Assuming that that the capacitance causes a delay of lone nanosecond (ns) for each 50 pF, the delay resulting from this capacitance will be 3.6 ns.

In comparison, consider the system without the switch. The 16 DIMMs will present a capacitance of 16 times 30, or 480 pF. The resulting delay of 9.6 ns is about three times as great, demonstrating the great improvement of the current invention.

Using a figure of 50 pF per lead rather that 25 pF per lead, as is common in the industry today, the figures are even more dramatic. Representing the stray capacitance by the characters CL, the calculations show a capacitance of about 205 pF+CL with the use of the current invention, and about 800 pF+CL using the standard method—a improvement of almost five to one. Experimental data using the current invention confirms these figures.

In an alternative embodiment, the signal (control signal) which controls the FET switch is generated externally to the memory board, and conveyed to the memory board via the edge connector. This control signal may be generated on a motherboard to which the memory modules are mounted by a controller chip specifically included for this purpose. An alternate embodiment includes generation of this control signal on a central processing unit (CPU) or controller located on the motherboard.

In another alternative embodiment, the memory is an integral part of the motherboard. As a result no separate memory boards or connectors therefor are involved in the invention; instead, the FET switch is mounted on the motherboard itself between the memory chips and the bus, and performs the same function in isolating the bus from the memory chips as in the first preferred embodiment.

In still another embodiment, the FET switches, or their equivalents, are included within the memory chips themselves, which may be located on memory boards, or directly on the motherboard itself. These FET switches are controlled in turn from the bus, which is connected to the memory modules.

DIMM TERMINATION BOARD

Figure 3:
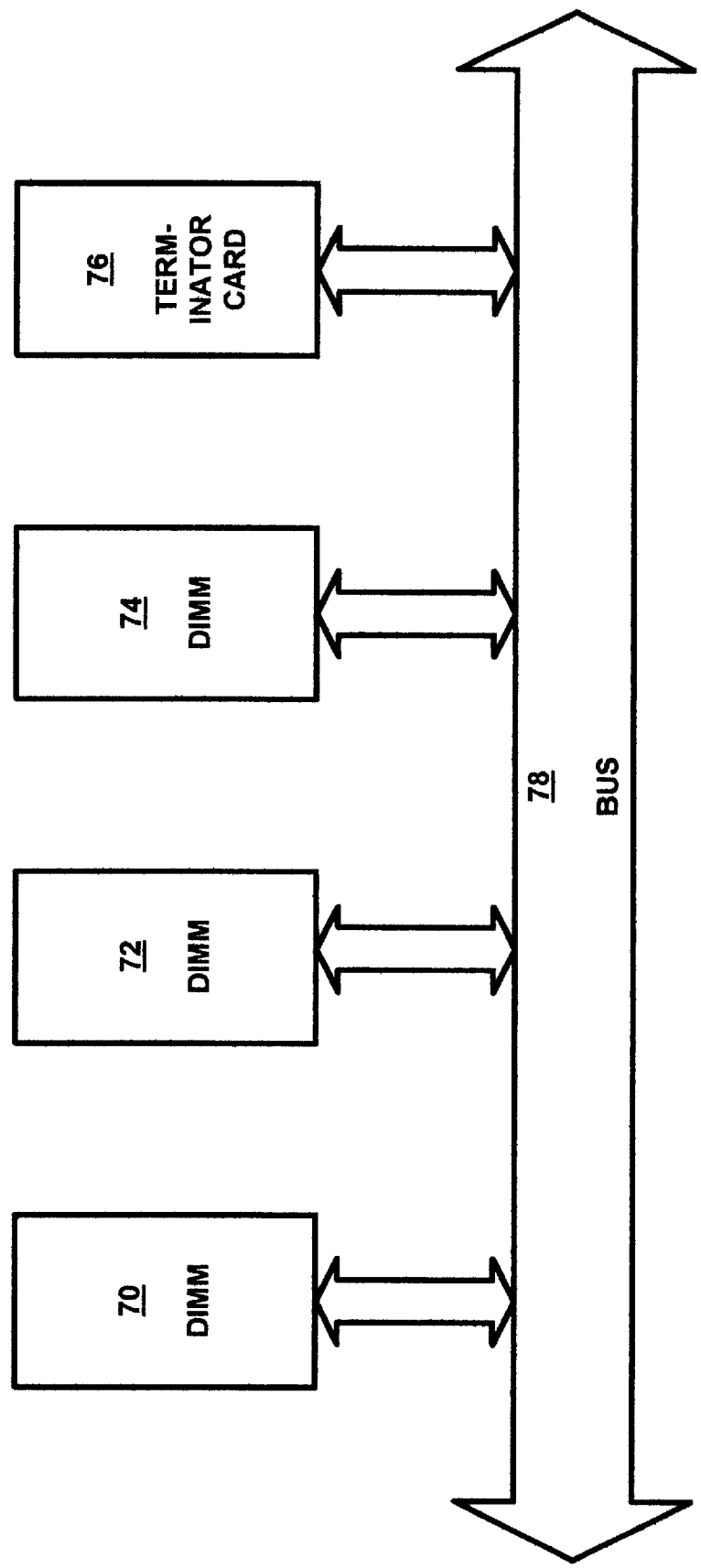
FIG. 3 depicts a bus populated with three DIMMS and a termination card.

Referring now to FIG. 3, the memory assembly consists of three DIMM boards, 70,72,74, which communicate over bus 78. In addition to the DIMM boards, the termination board 76 is also located on the bus, in place of a fourth DIMM board. This termination board is depicted in FIG. 4.

Figure 4:
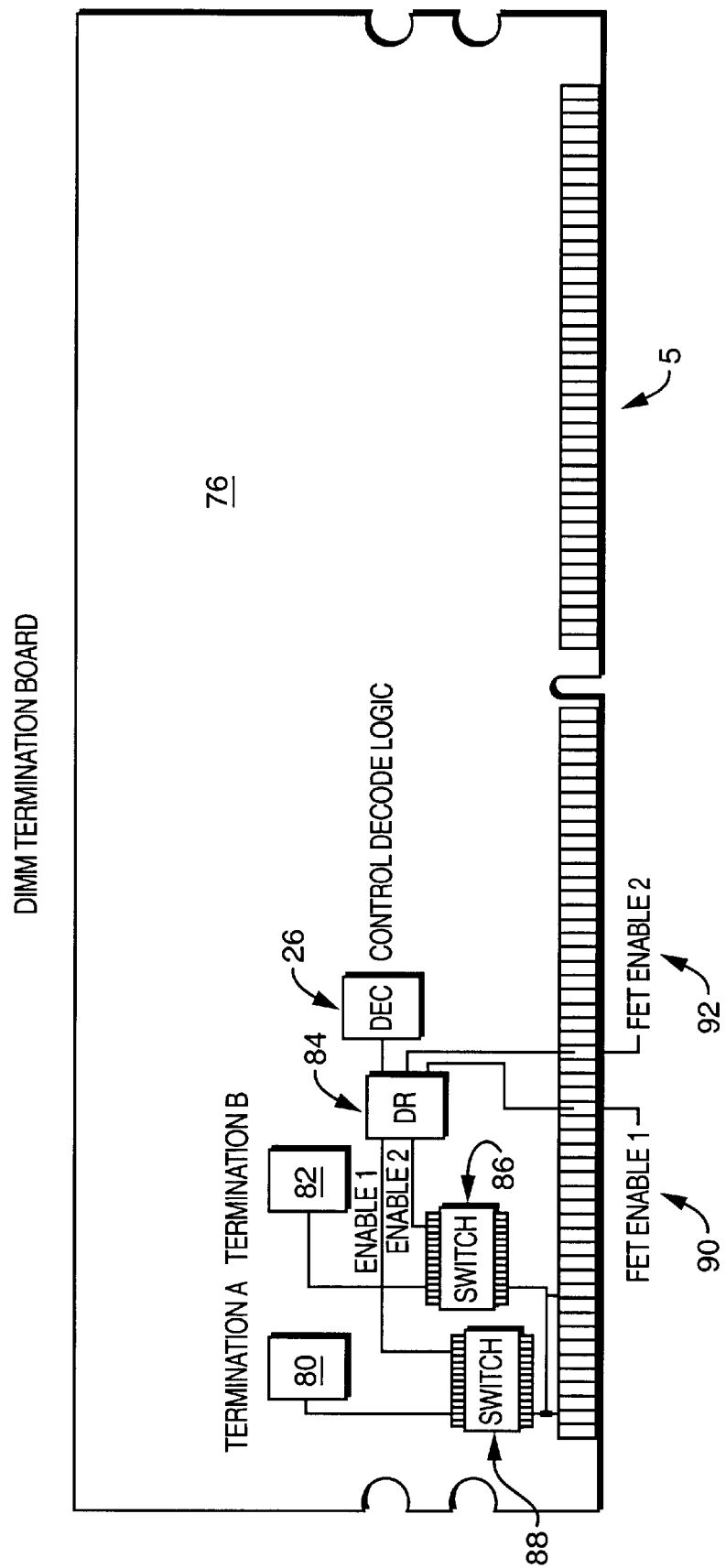
FIG. 4 depicts a DIMM termination card.

Referring now to FIG. 4, the termination board has the same dimensions as the corresponding DIMM board, and contains a comb of contacts 5 identical to the DIMM board. This comb contains a number of fingers which mate with connector 12, which is, in turn, mounted on motherboard 28.

Like the DIMM boards, the termination boards may be multi-layer boards, with interconnection between the different layers by means of feed-throughs which may connect with conductive material on each layer. Also like the DIMM boards, the chips shown mounted on the termination board are electrically connected through conductive mounting pads Although not shown in FIG. 4, chips may be located on both mounting surfaces of each substrate. The signals conveyed to the memory board might be generated by a controller chip rather than the CPU, as with the DIMMs. In either case, the signals are connected to the memory board by means of the bus, consisting of a multiplicity of data lines, a multiplicity of separate address lines, and a multiplicity of control lines.

Still referring to FIG. 4, FET switches 86 and 88 are mounted on the termination board 76 and inserted in series with each DATA LINE. Other types of switches are applicable to this application, including, inter alia, CMOS and TTL switches, and should be of the same type as those used on the DIMM.

Also shown in FIG. 4 are two termination chips 80 and 82. A FET switch 88 connects, or isolates the bus signals from termination A 80, and a second FET switch 86 connects, or isolates the bus signals from termination B 82. The data, address, and control lines are connected through the comb 5 to the terminations in a way identical to the connections of these lines to the DRAMS in the DIMM cards. Again, there are a multiplicity of switch elements in each FET switch, driving the data leads of the termination chips via a multiplicity of leads.

When the FET switch 88 is open, or in the OFF state, there will be a very high-impedance connection between the bus signals and the termination A 80. In effect, the switch appears to be the equivalent of an open circuit for each input lead connected to the switch. The impedance reflected onto the bus by termination A is thus negligible.

When FET switch 88 is enabled, on the other hand, the impedance of termination A appears on the bus as a terminating impedance.

In all of the alternative embodiments, the switches may be CMOS or TTL switches, in addition to the FET switches previously described.

As in the DIMM boards, the FET switches are located as close to the comb as possible, so as to minimize the effect of the leads between the comb and the switches in terms of added capacitance and signal delay and degradation.

Referring again to FIG. 3, it is apparent that when DIMM 70 is enabled (state 1) , and the other DIMMs disabled, the characteristic impedance will be different from that when, for instance, DIMM 74 is enabled (state 2), and the other DIMMS are disabled. Thus when the system is in state 1, the DIMM termination card 76 should select termination A, which corresponds to the characteristic impedance of state 1. When the system is in state 2, on the other hand, the DIMM termination card 76 should select termination b, which corresponds to the characteristic impedance of state 2.

As with the DIMM boards themselves, the switches can be accessed either through a specific FET ENABLE line 90, 92 designed for this particular purpose, through the FET switches themselves, or through the termination chips themselves. In all ways, the selection and enabling of the FET switches on the termination board is analogous to the selection and enabling of the FET switches on the DIMMs themselves, and uses the same techniques and circuitry.

It will be apparent that improvements and modifications may be made within the purview of the invention without departing from the scope of the invention defined in the appended claims.

I claim:

1. A method for enhancing the performance of an electronic system which comprises a multiplicity of printed circuit boards, a motherboard containing a bus, having a characteristic impedance, the method comprising:

a) terminating the bus with a termination card;
   b) mounting onto said termination card one or more switches, each having an on state and an off state, and each having an input and output, in which the input is connected to the output via a low resistance in the on state and a high resistance in the off state, and mounted to the board in proximity to the comb;
   c) mounting onto said termination card one or more termination chips, each of which is electrically connected to the output of a corresponding switch by a plurality of leads, and each of which presents an impedance to the output of the corresponding FET switch;
   d) conductively connecting a plurality of leads between the comb and the switches;
   e) providing selection means to turn the switches for each board on or off;
   and
   f) switching on one of the termination chips, so that only the termination chip selected is connected to the bus at any given time, the impedance presented by the selected termination chip being thus matched to the characteristic impedance of the bus.

2. The method of claim 1, wherein the switch is selected from the group which consists of field-effect transistor switches, complementary metal oxide semiconductor switches, and transistor-transistor logic switches.

3. An electronic device which comprises:

a multiplicity of printed circuit boards, each board further comprising a multiplicity of electronic components having a capacitance, and a comb of connecting terminals;
   a motherboard;
   a bus, having a characteristic impedance, contained on the motherboard;
   a multiplicity of connectors electrically connected to the bus, into each of which except one the comb of a corresponding board is matingly inserted and electrically connected, the terminals presenting a capacitance to the bus including the capacitance of the components;
   a switch mounted onto each such board in proximity to the comb, having an on state and an off state, and having an input and output, in which the input is connected to the output via a low resistance in the on state and a high resistance in the off state;
   a plurality of leads conductively connecting the combs and the input of the switch for each such board;
   a plurality of leads conductively connecting the output of the switch and the electronic components;
   selection means to simultaneously turn the switch of a single selected board on, while maintaining the non-selected boards off; and
   a terminator board further comprising:
   a) a comb of connecting terminals,
   b) one or more switches, each having an on state and an off state, and each having an input and output, in which the input is connected to the output via a low resistance in the on state and a high resistance in the off state, and mounted to the board in proximity to the comb;
   c) one or more termination chips, each of which is electrically connected to the output of a corresponding switch by a plurality of leads, and each of which presents an impedance to the output of the corresponding FET switch;
   d) a plurality of leads conductively connecting the comb and the switches;
   e) selection means to turn the switches for terminator board on or off, so that only a single board is connected to the bus at any time, and the terminator board presents the characteristic impedance of the bus.

4. An electronic apparatus comprising:

one or more printed circuit boards;
   a multiplicity of electronic components mounted on each board, each electronic component having a capacitance;
   a bus, having a characteristic impedance;
   a switch located on each board, the switch having an on state and an off state, each switch having a low resistance in the on state and a high resistance in the off state;
   a plurality of leads conductively connected to between the bus and the switches;
   a plurality of leads conductively connected between the switches and the electronic components;
   selection means to simultaneously turn the switch of a single selected board on, while maintaining the non-selected boards off, and
   a terminator board further comprising:
   a) a comb of connecting terminals,
   b) one or more switches, each having an on state and an off state, and each having an input and output, in which the input is connected to the output via a low resistance in the on state and a high resistance in the off state, and mounted to the board in proximity to the comb;
   c) one or more termination chips, each of which is electrically connected to the output of a corresponding switch by a plurality of leads, and each of which presents an impedance to the output of the corresponding FET switch;
   d) a plurality of leads conductively connecting the comb and the switches;
   e) selection means to turn the switches for terminator board on or off, so that only a single board is connected to the bus at any time, and the terminator board presents the characteristic impedance of the bus.

5. An electronic apparatus comprising:

a motherboard of insulating substrate having a network of conductive leads applied thereto, pads located on the motherboard for attaching memory elements,
   a multiplicity of memory elements mounted on the motherboard via the pads;
   a bus, having a characteristic impedance, conducting data and address leads to the memory elements;
   a plurality of switching devices having an on state and an off state, each switching device having a low resistance in the on state and a high resistance in the off state;
   a plurality of leads conductively connected to between the bus and the switching devices;
   a plurality of leads conductively connected between the switching devices and the memory element;
   means to turn selected switches on and off; and a terminator board further comprising:
 a) a comb of connecting terminals,
 b) one or more switches, each having an on state and an off state, and each having an input and output, in which the input is connected to the output via a low resistance in the on state and a high resistance in the off state, and mounted to the board in proximity to the comb;
 c) one or more termination chips, each of which is electrically connected to the output of a corresponding switch by a plurality of leads, and each of which presents an impedance to the output of the corresponding FET switch;
 d) a plurality of leads conductively connecting the comb and the switches; and
 e) selection means to turn the switches for terminator board on or off; so that connections to the bus are made to selected memory elements only, the non-selected memory elements being isolated from the bus, and the terminator board presents the characteristic impedance of the bus.

* * * * *